(12) United States Patent
Nagai

(10) Patent No.: US 6,503,804 B2
(45) Date of Patent: Jan. 7, 2003

(54) METHOD OF MANUFACTURING A SEMICONDUCTOR DEVICE

(75) Inventor: Yukihiro Nagai, Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/908,849

(22) Filed: Jul. 20, 2001

(65) Prior Publication Data

US 2002/0090825 A1 Jul. 11, 2002

(30) Foreign Application Priority Data

Jan. 11, 2001 (JP) .......................... 2001-003932

(51) Int. Cl.$^7$ ............................. H01L 21/336
(52) U.S. Cl. .................. 438/296; 438/435; 438/437
(58) Field of Search .................. 438/296, 297, 438/424, 425, 435, 437, 788

(56) References Cited

U.S. PATENT DOCUMENTS 5,985,735 A * 11/1999 Moon et al. ............... 438/435
6,153,480 A * 11/2000 Arghvani et al. ........... 438/296

FOREIGN PATENT DOCUMENTS

| JP | 11-145090 | 5/1999 |
| JP | 11-312730 | 11/1999 |

* cited by examiner

Primary Examiner—David Nelms
Assistant Examiner—Dung Anh Le
(74) Attorney, Agent, or Firm—McDermott, Will & Emery

(57) ABSTRACT

A method of manufacturing semiconductor device is provided which can minimize the thinning of a nitride layer in the planarization process and inhibit the peripheral area of the nitride layer from being excessively polished. The method of manufacturing semiconductor device includes the steps of: forming a nitride layer on a semiconductor substrate; patterning the nitride layer and etching the semiconductor substrate while masking with a pattern of the nitride layer to form a trench; depositing an oxide layer to fill the trench and cover the nitride layer; patterning a resist layer on the oxide layer; etching the oxide layer on the nitride layer; and planarizing the oxide layer, wherein the step of etching the oxide layer permits a thickness of the oxide layer to be left on the nitride layer.

16 Claims, 16 Drawing Sheets

MEMORY CELL     PERIPHERAL CIRCUIT

MEMORY CELL    PERIPHERAL CIRCUIT

| MEMORY CELL | PERIPHERAL CIRCUIT |

METHOD OF MANUFACTURING A SEMICONDUCTOR DEVICE

BACKGROUND OF THE INVENTION

The present invention relates to a method of manufacturing a semiconductor device having isolating oxide layers.

Generally, an isolating oxide layer is provided between any two functions allocated on a semiconductor substrate for inhibiting the effect of parasitic capacitance from the other functions in a semiconductor device. The isolating oxide layer may include that formed by local oxidation of silicon (hereinafter referred to as LOCOS) and a film formed in a trench by the use of an anisotropic etching technique. An oxide film formed in a shallow trench by the use of a shallow trench isolation (STI) technique is also available.

After the shallow trench has been formed, the trench is filled with an isolating oxide layer uniformly. However, the oxide layer formed has a varying thickness. For eliminating the non-uniformity, planarization is applied. The planarization is performed substantially uniformly throughout the surface and when variation in thickness is too large, they may hardly be compensated. Accordingly, a (pre-etching) process for etching the oxide layer is widely used for removing relatively taller regions of the isolating oxide layer to minimize surface undulations before the planarization process. In a common practice of the oxide layer etching, the oxide layer is etched until the nitride layer is exposed as shown in the cross sectional view of FIG. 22D. This is followed by removal of a resist layer for planarizing the surface and eliminating undulations.

In Japanese Laid-Open Patent Publication 11-312730, the isolating oxide layer deposited on a cell pattern of nitride silicon layer is etched so as to be substantially similar height to the upper surface of the nitride layer. In this case, the oxide layer on a peripheral area of the cell pattern of the nitride layer may be left.

In Japanese Laid-Open Patent Publication 11-145090, a method of manufacturing a semiconductor device having two-steps polishing process is disclosed. The one polishing process is applied for polishing down to a polishing stopper layer which has been provided and then another polishing process is carried out for removing the polishing stopper layer.

However, when the oxide layer has been etched down to the upper side of the nitride layer, the nitride layer is exposed and then polished in the planarization process, resulting in undesirable reduction of the film thickness of the nitride layer. Also, the pre-etched regions of the oxide layer are again etched by the oxide layer etching process and thus becomes thinner than the other regions. The subsequent planarization process will cause the isolating oxide layer adjacent the pre-etched regions to be stepped down sharply from the edge of each trench as shown in FIG. 23D.

In the Japanese Laid-Open Patent Publication 11-312730, during the semiconductor device manufacturing method, the oxide layer on the nitride layer is substantially flush with the oxide layer filling the trench. Accordingly, if the oxide layer on the nitride layer is relatively thin, it may excessively be polished down about the nitride layer during the planarization process.

In the other semiconductor device manufacturing method disclosed in the Japanese Laid-Open Patent Publication 11-145090, the stopper layer has to be prepared before the planarization process. The preparation of the stopper layer requires another step of forming it. In the etching process before the planarization process, as the oxide layer is etched down to the stopper layer, no etching adjustment will be allowed.

SUMMARY OF THE INVENTION

Therefore, it is an object of the present invention to provide a method of manufacturing a semiconductor device which can minimize the thinning of the nitride layer in the planarization process and inhibits the peripheral area of the nitride layer from being excessively be polished down.

In accordance with one aspect of the present invention, there is provided a method of manufacturing a semiconductor device. The method includes following the steps of:
(a) providing a semiconductor substrate;
(b) forming a trench in the semiconductor substrate;
(c) depositing an oxide layer to fill the trench and cover the surface of the semiconductor substrate;
(d) etching the oxide layer so as to leave a thickness of the oxide layer; and
(e) planarizing the surface of the semiconductor substrate.

In another aspect of the present invention, there is provided a method of manufacturing a semiconductor device. The method includes following the steps of:
(a) providing a semiconductor substrate;
(b) forming a nitride layer on the semiconductor substrate;
(c) patterning the nitride layer;
(d) etching the semiconductor substrate while masking with a patter of the nitride layer to form a trench;
(e) depositing an oxide layer to fill the trench and cover the nitride layer;
(f) forming a resist layer on the oxide layer;
(g) patterning the resist layer;
(h) etching the oxide layer on the nitride layer; and
(i) planarizing the oxide layer.

In addition the step of etching the oxide layer permits a thickness of the oxide layer to be left on the nitride layer.

In a further aspect of the present invention, during the step of depositing the oxide layer, the oxide layer may be deposited to a controlled thickness determined from the thickness of the oxide layer left during the step of etching the oxide layer.

In a still further aspect of the present invention, during the step of depositing the oxide layer, the oxide layer may be deposited to a controlled thickness determined from a ratio of area between the nitride layer peripheral area including the nitride area itself and the oxide layer filling the trench.

In a yet further aspect of the present invention, during the step of etching the oxide layer, the oxide layer may be etched to leave a thickness of the oxide layer determined from a ratio of area between the nitride layer peripheral area including the nitride area itself and the oxide layer filling the trench.

In a yet further aspect of the present invention, during the step of depositing the oxide layer, the oxide layer may be deposited to a controlled thickness determined corresponding to the distance from the center of a wafer where the semiconductor substrates are provided.

In a yet further aspect of the present invention, during the step of etching the oxide layer, the oxide layer may be etched to a controlled depth determined corresponding to the distance from the center of a wafer where the semiconductor substrates are provided.

In a yet further aspect of the present invention, during the step of etching the oxide layer, the oxide layer may be etched at an area distanced from the trench.

In a yet further aspect of the present invention, the area to be etched may be determined from a ratio of area between the nitride layer peripheral area including the nitride area itself and the oxide layer filling the trench.

In a yet further aspect of the present invention, during the step of planarizing, the planarizing processes may be performed several times.

In a yet further aspect of the present invention, during the step of planarizing, the planarizing processes with different degrees of polishing may be performed several times.

In a yet further aspect of the present invention, the method may further include a step of measuring the thickness of the oxide layer left on the nitride layer to determine the degree of polishing for the succeeding planarizing process between any two planarizing processes in the planarizing step.

According to the method of this invention, the compensating thickness of the oxide layer may be left on the nitride layer during the etching process of the oxide layer prior to the planarization process. Accordingly, the thinning of the nitride layer can be minimized in the planarization process and the peripheral area of the nitride layer can be inhibited from being excessively polished down.

According to the method of this invention, the compensating thickness of the oxide layer may be left on the nitride layer during the etching process of the oxide layer prior to the planarization process. Accordingly, the thinning of the nitride layer can be minimized in the planarization process and the peripheral area of the nitride layer can be inhibited from being excessively polished down.

According to the method of this invention, the oxide layer may be deposited to a controlled thickness determined from the compensating thickness of the oxide layer left in the step of etching the oxide layer. As a result, the compensating thickness of the oxide layer on the nitride layer can easily be provided as a margin.

According to the method of this invention, the oxide layer may be deposited to a controlled thickness determined from the ratio of area between the nitride layer peripheral area including the nitride layer itself and the oxide layer filling the trench. Therefore, any area to be not over-polished can be protected.

According to the method of this invention, the oxide layer may be etched to leave a thickness of the oxide layer determined from the ratio of area between the nitride layer peripheral area including the nitride layer itself and the oxide layer filling the trench. Therefore, the over-polishing can selectively be made.

According to the method of this invention, the oxide layer may be deposited to a controlled thickness determined corresponding to the distance from the center of the wafer. Therefore, the thickness of the oxide layer can be uniform after the step of etching the oxide layer while discrepancy in the etching rate between different locations on the wafer is favorably compensated.

According to the method of this invention, the oxide layer to be etched to a controlled depth determined corresponding to the distance from the center of the wafer. Therefore, the thickness of the oxide layer can be uniform after the step of etching the oxide layer while discrepancy in the etching rate between different locations on the wafer is favorably compensated.

According to the method of this invention, the oxide layer to be etched at the area distanced from the trench. Therefore, the over-polishing can selectively be carried out.

According to the method of this invention, the area to be etched may be determined from the ratio of area between the nitride layer peripheral area including the nitride layer itself and the oxide layer filling the trench. Therefore, the over-polishing can be made with different degrees of polishing determined depending on the pattern of the nitride layer.

According to the method of this invention, the planarizing processes may be performed several times. Therefore, the degree of polishing can be controlled at each planarization process.

According to the method of this invention, the planarizing processes may be performed with different degree of polishing. For example, a combination of the planarization for having a higher flatness and the planarization with a higher selectivity for the nitride layer can produce a higher flatness on the finished surface while inhibiting the nitride layer from being excessively polished.

According to the method of this invention, the degree of polishing at the next step to be determined by measuring the thickness of the oxide layer left on the nitride layer between any two planarizing processes. Therefore, the overpolishing can be avoided.

DETAILED DESCRIPTION OF THE PREFERRED EMBODIMENTS

Figure 1A:
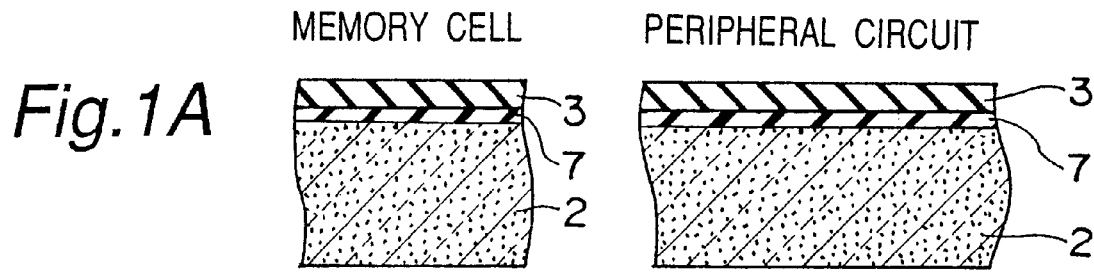
FIGS. 1A to 1D are cross sectional views showing the sequence of manufacture of the semiconductor device of a first embodiment of the present invention.

A method of manufacturing a semiconductor device according to the present invention includes a step of etching to a controlled depth an oxide layer deposited over a nitride layer on the substrate before the planarization process. More specifically, in the semiconductor device manufacturing method of the present invention, a compensating thickness of the oxide layer stays left on the nitride layer. This can offset excessive polishing after the etching of the oxide layer and prevent thinning of the nitride layer. Alternatively, the oxide layer is deposited to a predetermined thickness determined from the compensating thickness to be left on the nitride layer and its thickness variation after the etching can be minimized. Also, with reference to a ratio of area between the nitride layer peripheral area including the nitride layer itself and the oxide layer filling the trench, the oxide layer is deposited to the predetermined thickness and then etched to a controlled depth so as to leave the compensating thickness thereof at a desired area. Accordingly, the desired area can selectively be over-polished while the other area remains protected from. Moreover, the oxide layer is adjustably deposited to different thickness corresponding to the distance from the center of a wafer so that its variation in the etching rate from one area to another on the wafer can be offset, hence leveling the thickness of the oxide layer after the etching process. Furthermore, since the oxide layer is etched at an area spaced by a predetermined distance from the trench, the polishing during the planarization corresponding to a pattern of the nitride layer can be optimized for avoiding over-polishing. Finally, a plurality of the planarization are carried out at different levels of polishing, thus ensuring a high flatness of the layer surfaces and minimizing over-polishing of the nitride layer.

A semiconductor device manufacturing method of the first embodiment of the present invention includes a step of etching to a controlled depth of the oxide layer to be left on the nitride layer on a substrate so as to leave a compensating thickness of the same. More specifically, a desired thickness of the oxide layer is left on the nitride layer in the semiconductor device manufacturing method of this embodiment. The semiconductor device manufacturing method includes the steps of:

(a) providing a semiconductor substrate;
(b) forming a nitride layer on the semiconductor substrate;
(c) patterning the nitride layer;
(d) digging a trench in the nitride layer while masking the pattern of the nitride layer;
(e) depositing an oxide layer to fill up the trench and cover the nitride layer;
(f) providing a resist layer on the oxide layer;
(g) patterning the resist layer;
(h) etching (pre-etching) the oxide layer on the nitride layer; and
(i) planarizing the oxide layer.

In the etching step, the oxide layer is controllably etched to a desired depth. This allows the nitride layer to remain not exposed to the planarization and prevented from being thinned during the planarization. Also, as the removal of the oxide layer is moderated during the pre-etching, over-polishing will be offset in the planarization.

Figure 1B:
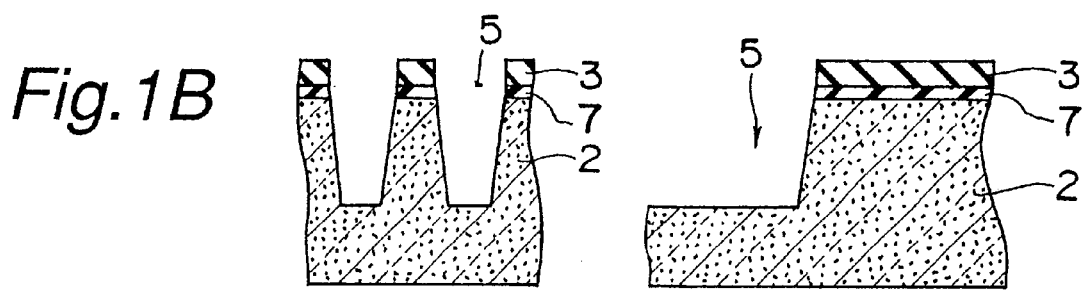
Figure 1C:
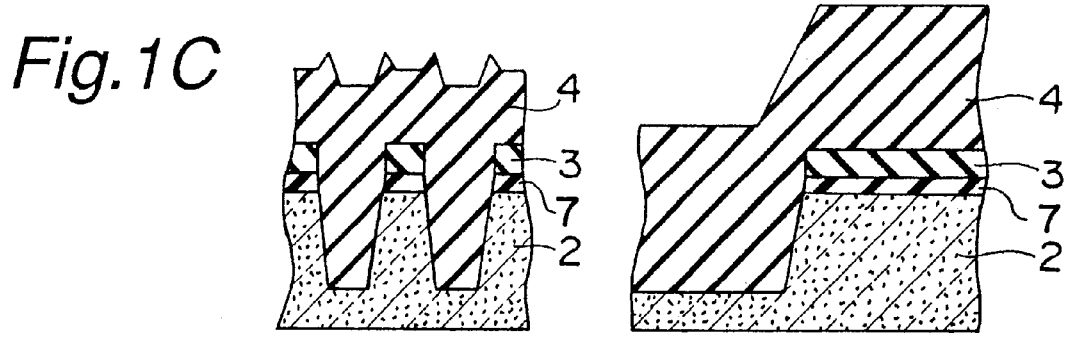
Figure 1D:
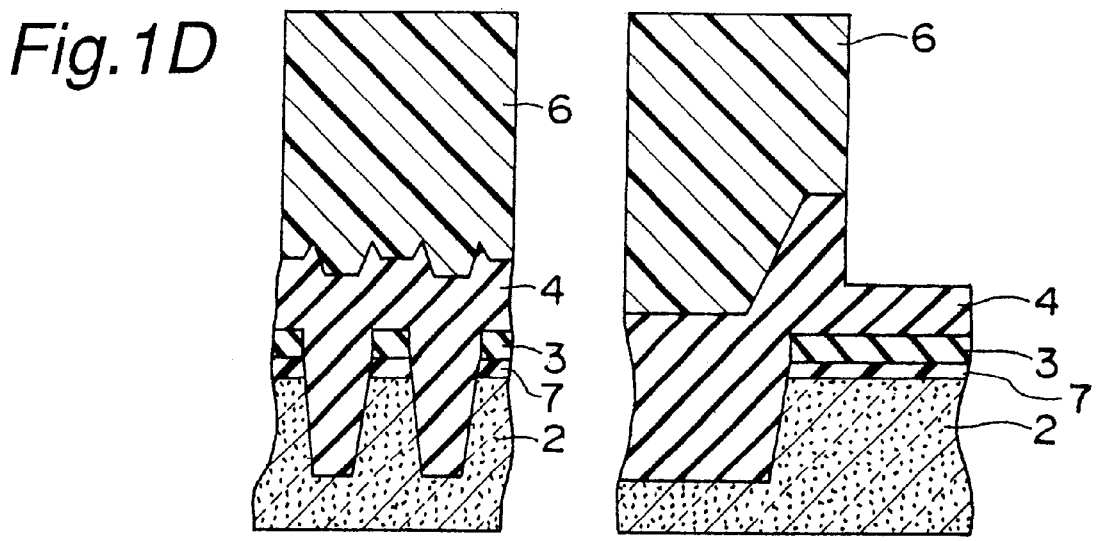
Figure 2A:
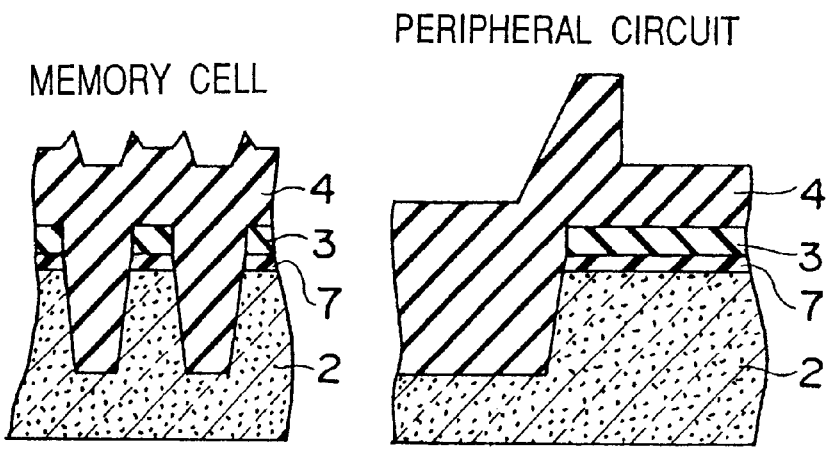
FIGS. 2A to 2C are cross sectional views showing the sequence, which is continued from FIG. 1D, of manufacture of the semiconductor device of the first embodiment of the present invention.
Figure 2B:
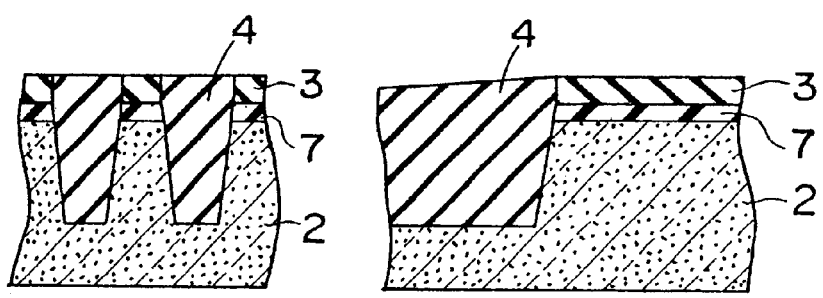
Figure 2C:
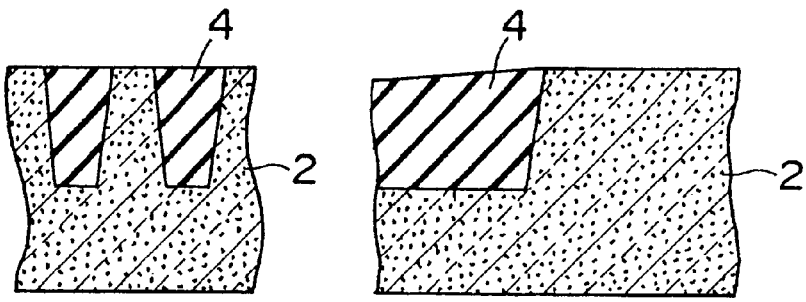

In more detail, the semiconductor device manufacturing method includes following steps as shown in FIGS. 1 and 2:

(1) depositing a nitride layer 3 on the thin oxide layer 7 on the semiconductor substrate 2. Preferably, before depositing the nitride layer 3, the semiconductor substrate 2 may be oxidized, then the thin oxide layer 7 may be formed on the semiconductor substrate 2 as shown in FIG. 1A;

(2) patterning the nitride layer 3 by a photo-lithographic technique and digging a trench in the semiconductor substrate 2 by etching while masking with a pattern of the nitride layer 3 as shown in FIG. 1B;

(3) depositing an oxide layer 4 by a high density plasma chemical vapor deposition (hereinafter referred to as HDP-CVD) technique to fill the trench 5 and cover the nitride layer 3 as shown in FIG. 1C;

(4) providing and patterning a resist layer 6 by a photo-lithographic technique;

(5) pre-etching to a controlled depth of the oxide layer 4 on the nitride layer 3 while masking with a pattern of the resist layer 6 as shown in FIG. 1D;

(6) removing the resist layer 6 as shown in FIG. 2A;

(7) planarizing the oxide layer 4 by chemical mechanical polishing (hereinafter referred to as CMP) technique as shown in FIG. 2B; and (8) removing the part of the oxide layer 4 and the entirety of the nitride layer 3 by wet etching before finally removing further part of the oxide layer 4 as shown in FIG. 2C. If the thin oxide layer 7 is formed, the oxide layer 7 may be removed by wet etching.

The semiconductor substrate 2 may be a silicon substrate. The nitride layer 3 may include a silicon nitride layer while the oxide layer 4 may include a silicon oxide layer. The technique of depositing the nitride layer 3 and the oxide layer 4 is not limited to the HDP-CVD but any other applicable technique may be used.

While the CMP method may be used for the planarization in this embodiment, its polishing characteristic may be varied depending on the application.

Another semiconductor device manufacturing method of the second embodiment of the present invention includes a step of depositing an oxide layer to a predetermined thickness determined from a compensating thickness to be left on the nitride layer in a step of oxide layer etching. Accordingly, as the predetermined thickness of the oxide layer is determined through accounting variations in the thickness of deposition and variations in the etching depth during the step of etching the oxide layer, the compensating thickness of the oxide layer left on the nitride layer can be undertaken.

Figure 3A:
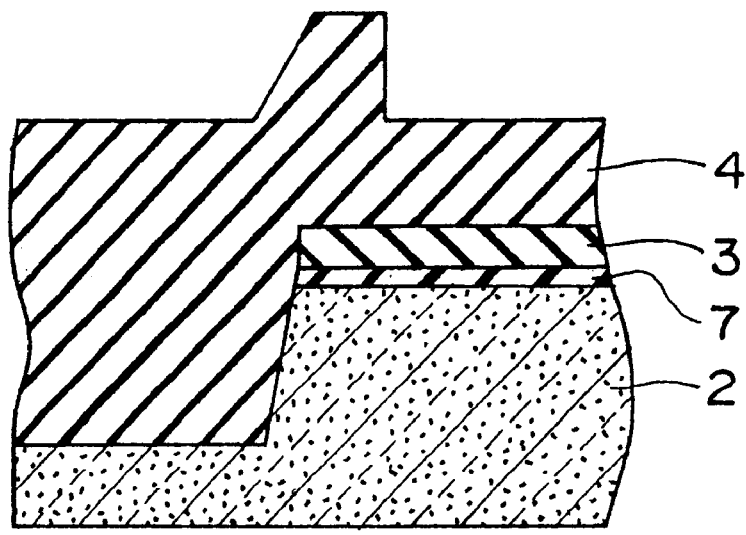
FIG. 3A is a cross sectional view after the step of etching the oxide layer in the semiconductor device manufacturing method of a second embodiment of the present invention.
Figure 3B:
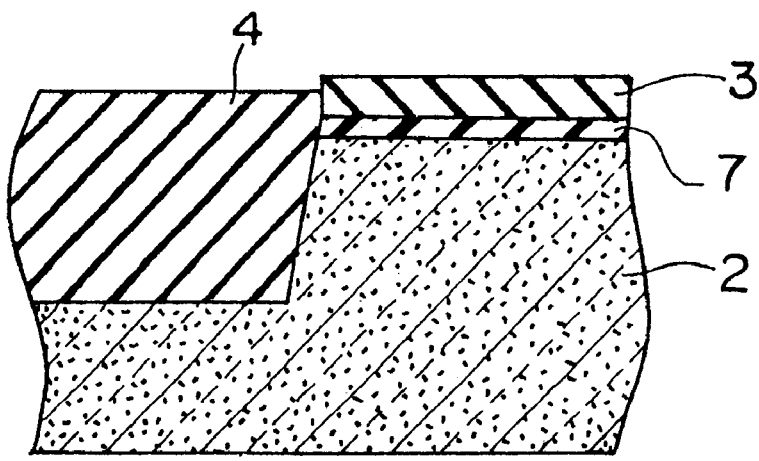
FIG. 3B is a cross sectional view after the step of planarizing in the same.

As compared with the method of the first embodiment, the semiconductor device manufacturing method of this embodiment differs from the method of the first embodiment in that the oxide layer 4 is adjustably deposited as shown in FIG. 3A to a predetermined thickness in the deposition step so that the oxide layer 4 filling the trench 5 is substantially equal in height to the oxide layer 4 deposited on the nitride layer 3 as shown in FIG. 3B. More particularly, the deposition of the oxide layer is carefully controlled to the predetermined thickness which includes a margin for inhibiting the subsequent etching from not reaching the nitride layer below. For example, if the HDP-CVD process creates a difference of 30 nm in the thickness and the oxide layer etching process forms also a difference of 30 nm in the depth, it is preferable to leave at least 30 nm of the compensating thickness of the oxide layer on the nitride layer after the etching. For ensuring at least 30 nm of the compensating thickness of the oxide layer for inhibiting the etching from reaching the nitride layer, the oxide layer has to be deposited 90 nm of a thickness at the center on the nitride layer. This margin will then inhibit the etching process from reaching the nitride layer below the oxide layer.

Figure 4A:
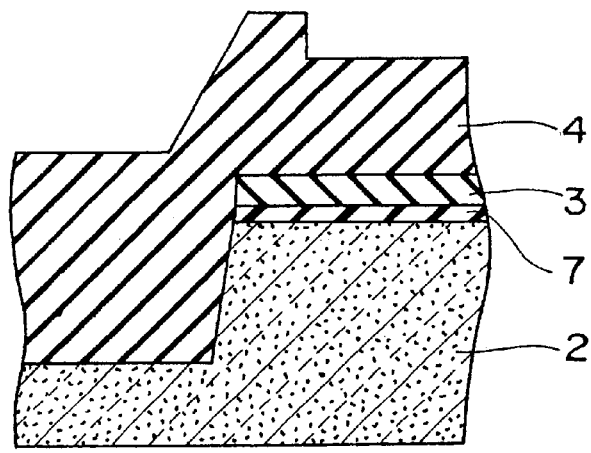
FIG. 4A is a cross sectional view after the step of etching an oxide layer in a conventional semiconductor device manufacturing method.
Figure 4B:
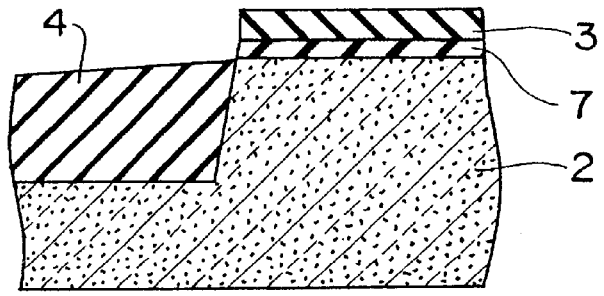
FIG. 4B is a cross sectional view after the step of planarizing in the same.
Figure 5A:
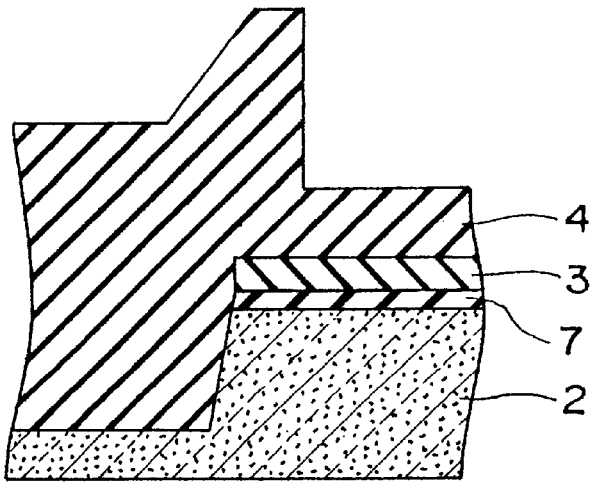
FIG. 5A is a cross sectional view after the step of etching an oxide layer in a conventional semiconductor device manufacturing method.
Figure 5B:
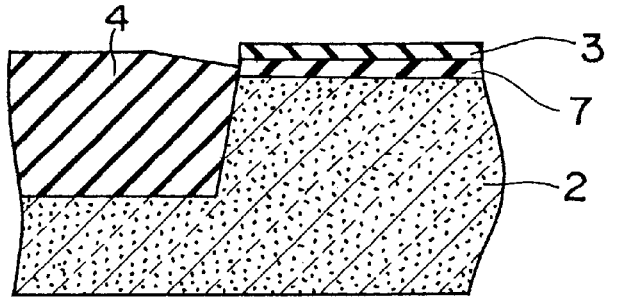
FIG. 5B is a cross sectional view after the step of planarizing in the same.

Meanwhile, if the oxide layer 4 is deposited to a less thickness, its height on the nitride layer 3 may be higher than that of the oxide layer 4 filling the trench as shown in a cross sectional view of FIG. 4A. When the oxide layer 4 is deposited too high on the nitride layer 3, its portion filling the trench may excessively be polished off as shown in FIG. 4B. If the oxide layer 4 is deposited too thick, its height on the nitride layer 3 may be lower than that of the oxide layer 4 filling the trench 5 as shown in FIG. 5A. When the oxide layer 4 is deposited too low on the nitride layer 3, it may easily be polished off up to the nitride layer 3. The semiconductor device manufacturing method of this embodiment permits the oxide layer to be adjustably deposited to a predetermined thickness, thus ensuring the flatness of the oxide layer after the oxide layer etching process.

A further semiconductor device manufacturing method of the third embodiment of the present invention includes a step of adjustably depositing an oxide layer to a predetermined thickness determined from the compensating thickness of the oxide layer left during the etching process. More specifically, when it is desired that a memory cell is over-polished, the oxide layer is deposited less and the etching is controlled to leave the compensating thickness over the peripheral area where no over-polishing is desired. If the peripheral area is desired to be over-polished, the deposition is made thick but the etching is controlled to a depth for leaving a less thickness of the oxide layer. Since the oxide layer is adjustably deposited to a predetermined thickness determined from the compensating thickness of the oxide layer left on the nitride layer during the etching, the area to be over-polished can be discriminated from the area where the over-polishing is not desired.

Figure 6A:
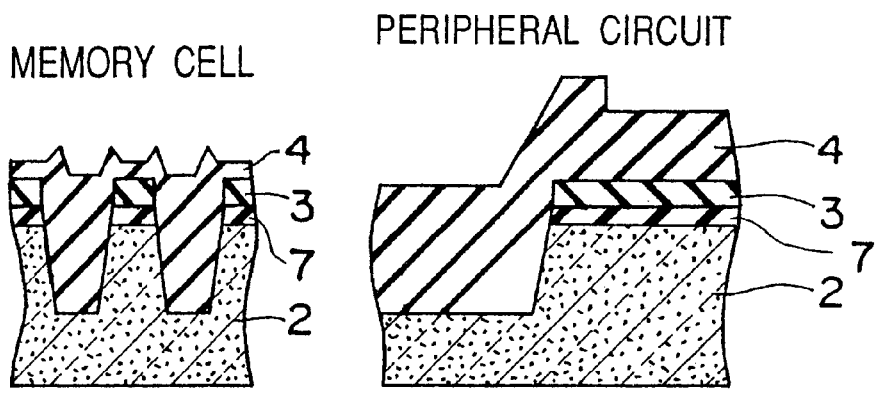
FIG. 6A is a cross sectional view after the step of etching an oxide layer in a semiconductor device manufacturing method of a third embodiment of the present invention.
Figure 6B:
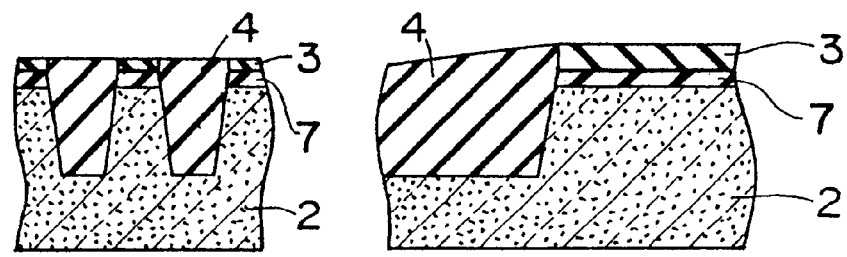
FIG. 6B is a cross sectional view after the step of planarizing in the same.

In a practice of the semiconductor device manufacturing method, the oxide layer is deposited thin over the memory cell area where the over-polishing is desired as shown in FIG. 6A and etched to a predetermined depth to leave a compensating thickness thereof at the peripheral area on the nitride layer as shown in FIG. 6B. This allows the memory cell to be over-polished while the peripheral area of the nitride layer is protected with the remaining of the oxide layer. This embodiment controls the deposition of the oxide layer during the deposition step and also the etching process to leave the compensating thickness of the oxide layer. Accordingly, one particular area is over-polished while the other area can be protected from the over-polishing.

Figure 7A:
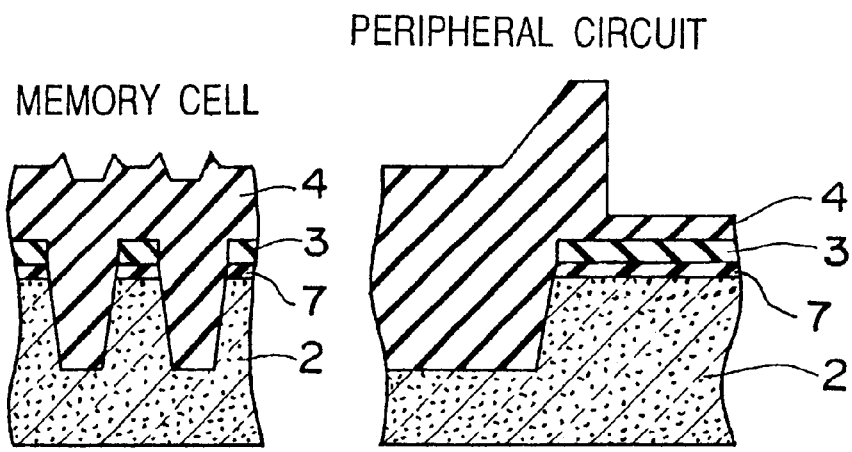
FIG. 7A is a cross sectional view after the step of etching an oxide layer in a modification of the semiconductor device manufacturing method of the third embodiment of the present invention.
Figure 7B:
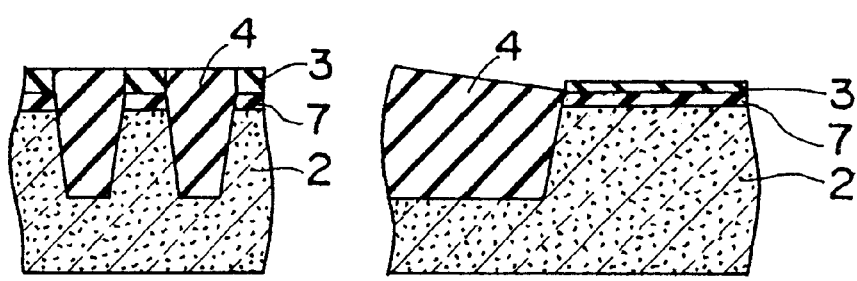
FIG. 7B is a cross sectional view after the step of planarizing in the same.
Figure 8A:
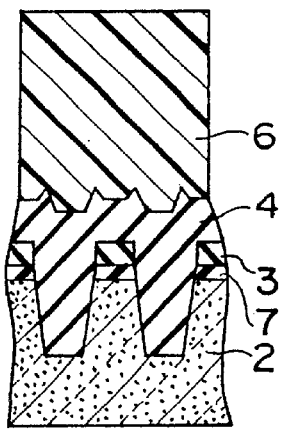
FIGS. 8A and FIG. 8B are cross sectional views after the step of etching an oxide layer to leave a thickness of the oxide layer in another modification of the semiconductor device manufacturing method of the third embodiment of the present invention.
Figure 8A:
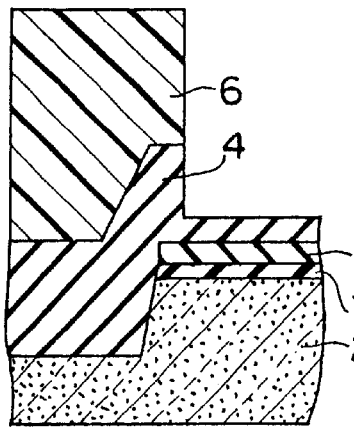
Figure 8A:
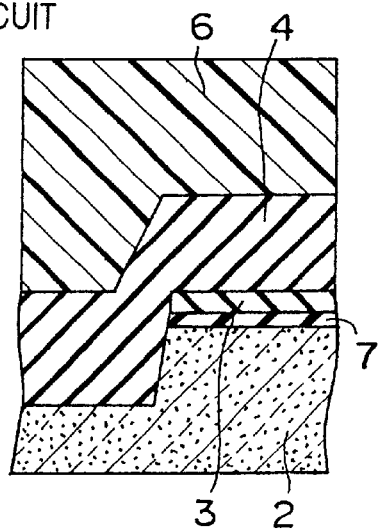
Figure 8B:
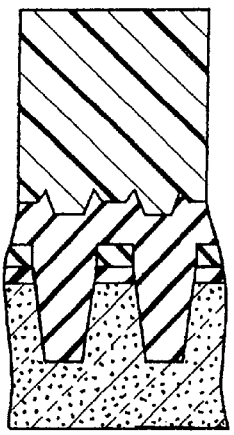
Figure 8B:
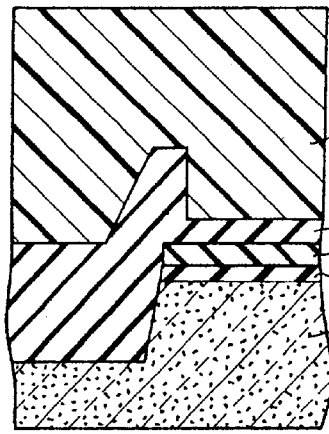
Figure 8B:
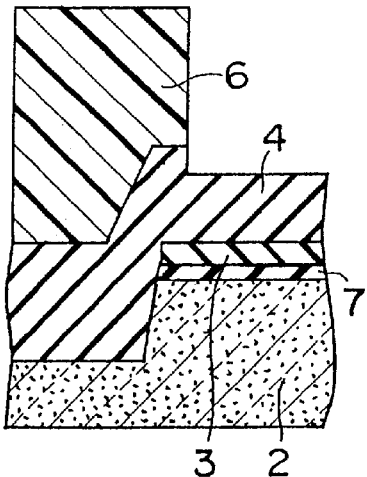
Figure 8C:
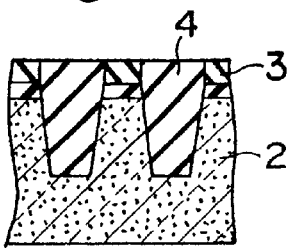
FIG. 8C is a cross sectional view after the step of planarizing in the same.
Figure 8C:
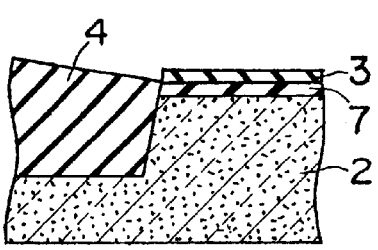
Figure 8C:
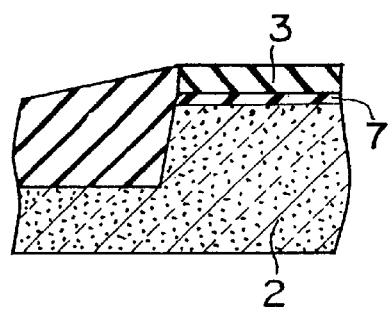

Similarly, before the oxide layer left on the nitride layer is over-polished, the oxide layer is deposited thick as shown in FIG. 7A and etched less to leave the compensating thickness thereof as shown in FIG. 7B. This allows the overpolishing to be performed up to the nitride layer while the memory cell area is protected. Also, the oxide layer is etched not uniformly from one area to another to leave an uneven thickness thereof as shown in FIGS. 8A, and 8B, hence discriminating the area to be over-polished from the other to be not over-polished as shown in FIG. 8C. In that case, a pattern of the resist layer 6 may be provided whenever the compensating thickness of the oxide layer is changed from one level to another as shown in FIGS. 8A and 8B.

A semiconductor device manufacturing method of the fourth embodiment of the present invention includes a step of adjustably depositing an oxide layer to different thicknesses corresponding to the distance from the center of a wafer on which semiconductor device are manufactured.

More specifically, the oxide layer is deposited relatively thick close to the center of the wafer and relatively thin at the other area far from the center, in other words, at the edge of the wafer. This can compensate for unevenness of the thickness of the oxide layer between the center and the edge of the wafer after the etching process.

Figure 9A:
FIG. 9A is a cross sectional view of a wafer on which an oxide layer is deposited by a semiconductor device manufacturing method of the fourth embodiment of the present invention.
Figure 9B:
FIG. 9B is a cross sectional view of a wafer on which an oxide layer is deposited by a conventional semiconductor device manufacturing method.
Figure 10A:
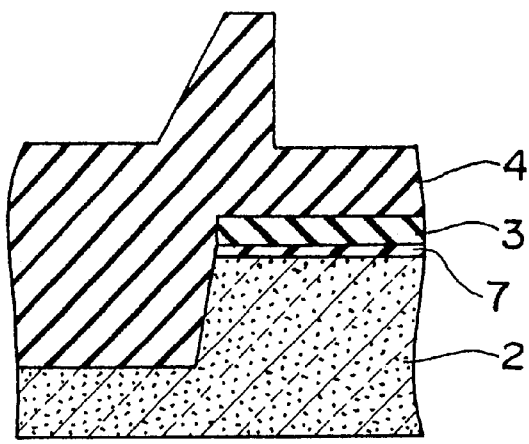
FIG. 10A is a cross sectional view after the step of etching an oxide layer in a semiconductor device manufacturing method according to the fourth embodiment of the present invention.
Figure 10B:
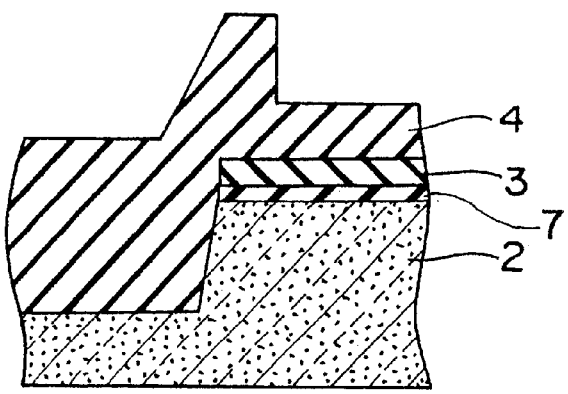
FIG. 10B is a cross sectional view after the step of planarizing in the same.
Figure 11A:
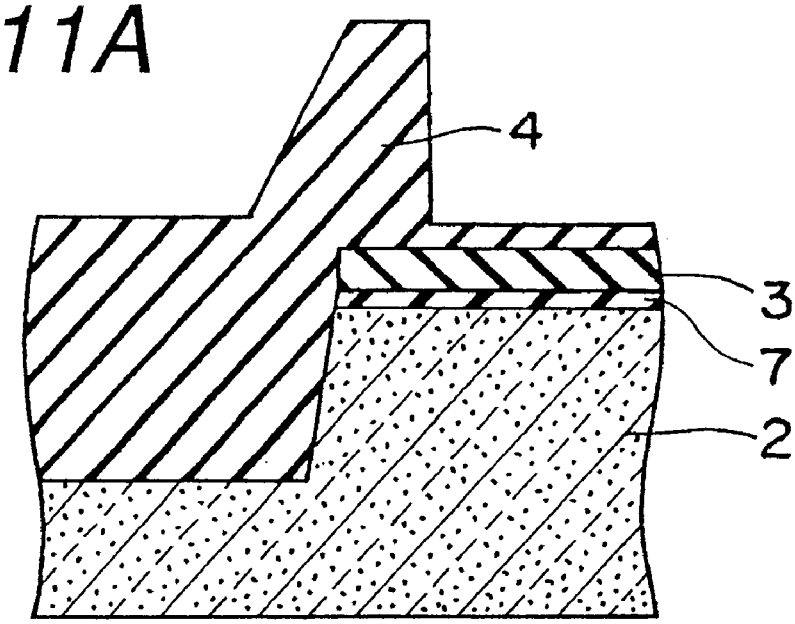
FIG. 11A is a cross sectional view after the step of etching an oxide layer in a conventional semiconductor device manufacturing method.
Figure 11B:
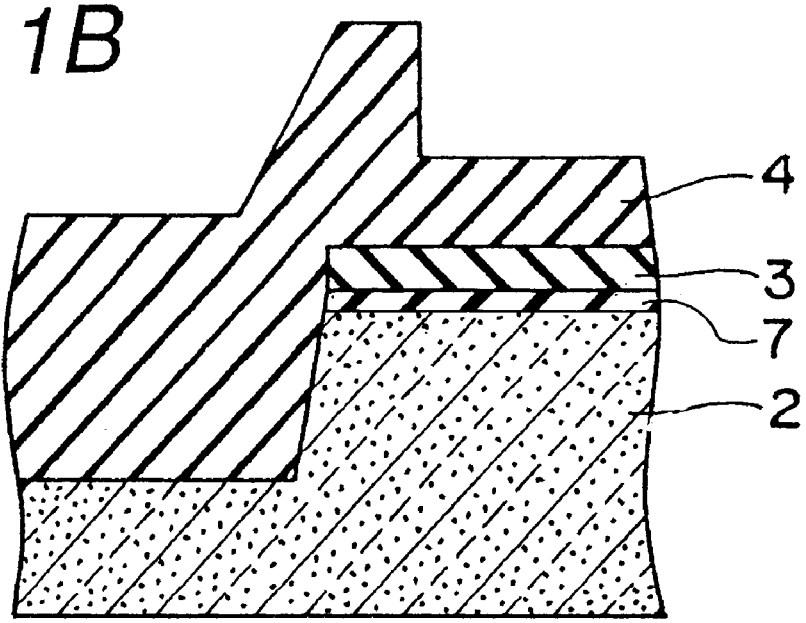
FIG. 11B is a cross sectional view after the step of planarizing in the same.

In more detail, the semiconductor device manufacturing method deposits the oxide layer 4 relatively thick about the center of the wafer and relatively thin close to the edge as shown in FIG. 9A. Generally, the oxide layer 4 deposited to a predetermined thickness on the wafer has a cross section such as shown in FIG. 9B. In the etching process, the etching rate becomes greater about the center of the water and smaller close to the edge. Consequently, the oxide layer 4 on the nitride layer is thinned about the center of the wafer, as shown in FIG. 11A, by the etching process prior to the planarization while remains thick close to the edge, as shown in FIG. 11B. In other words, the oxide layer 4 on the wafer is not uniform in the thickness. For compensation for the non-uniformity, the semiconductor device manufacturing method of this embodiment allows the deposition of the oxide layer to be varied corresponding to the distance from the center of the wafer as shown in FIG. 9B. Accordingly, the oxide layer can substantially be equal in thickness between the central area as shown in FIG. 10A and the peripheral area as shown in FIG. 10B of the wafer, creating no difference. When it is desired to have the oxide layer deposited not uniform in thickness or to over-polishing the central area of the wafer, the deposition of the oxide layer may be thin at the central area and thick at the peripheral area of the wafer. Also, the deposition of the oxide layer is not limited to a uniformly incremental change in the thickness from the center to the edge of the wafer. The thickness of the oxide layer may be varied in a curved profile. Alternatively, the thickness may be increased at two or more areas between the center and the edge of the wafer.

A semiconductor device manufacturing method of the fifth embodiment of the present invention includes a step of etching the oxide layer at an area spaced by a specific distance from the trench. The etching area is determined from a ratio of area between the nitride layer peripheral area including the nitride layer itself and the oxide layer filling the trench. Accordingly, in the etching of the oxide layer, the area to be over-polished can be discriminated from the other area to be protected from the over-polishing. As the oxide layer is etched at a ratio of area between the nitride layer peripheral area including the nitride layer itself and the oxide layer filling the trench, a change in the polishing effect depending largely on the pattern of the nitride layer can be compensated during the planarization. The peripheral area of the nitride layer may extend from one nitride layer to the other nitride layer on the other side of the trench. The peripheral area of the nitride layer may be a range which is susceptible to the polishing effect.

After the planarization, the polishing effect may be differentiated by the pattern of the nitride layer. For example, if the nitride layer is very close to trench such as in the memory cell and the ratio of area of the nitride layer peripheral area to the trench is large, the nitride layer may selectively be concerned in the planarization and hence remain less polished off. On the other hand, when the nitride layer is uniform such as in the peripheral area or isolated and its ratio of area to the oxide layer filling the trench is small, it may highly be polished off and thinned by the planarization. The over-polishing over the memory cell will thus cause the nitride layer in the peripheral area to be excessively thinned. For compensation, the semiconductor device manufacturing method of this embodiment controls the depth of the etching of the oxide layer corresponding to the pattern of the nitride layer.

Figure 12A:
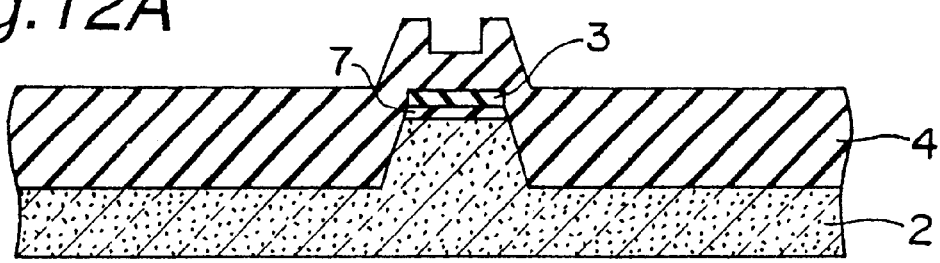
FIG. 12A and FIG. 12B are cross sectional views after the step of etching an oxide layer isolated on a nitride layer in a semiconductor device manufacturing method of the fifth embodiment of the present invention.
Figure 12B:
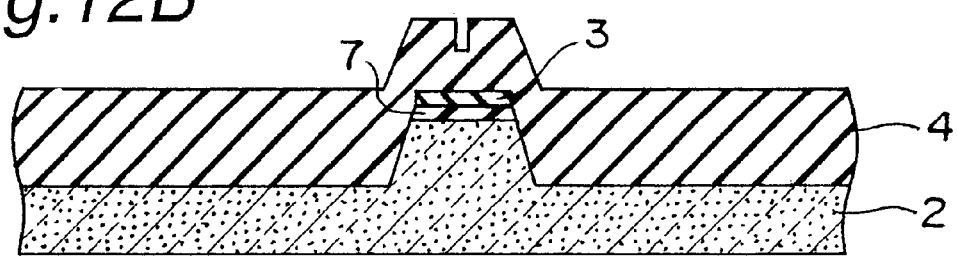
Figure 13A:
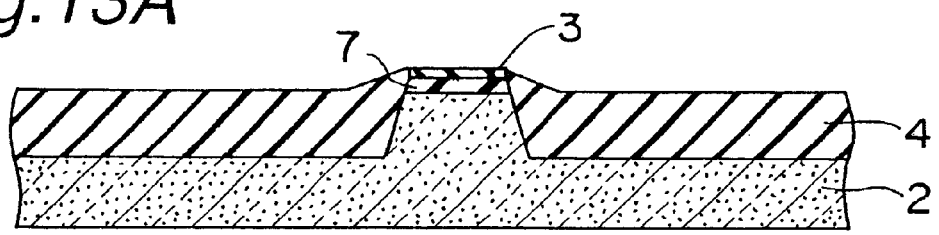
FIG. 13A and FIG. 13B are cross sectional views after the step of planarizing which follows the step shown in FIG. 12A and FIG. 12B, respectively.
Figure 13B:
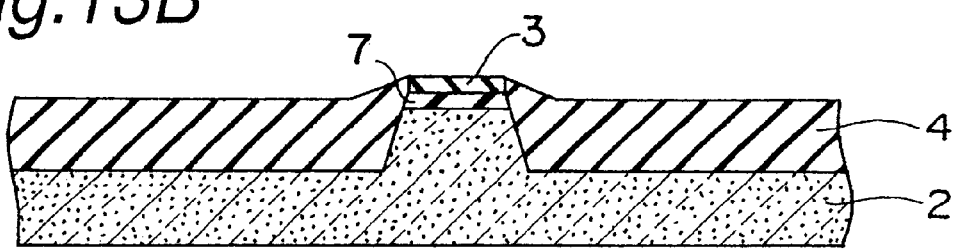

In more detail, the semiconductor device manufacturing method of this embodiment has a step of, when the nitride layer is isolated and the overpolishing to the nitride layer is desired, etching the oxide layer at an area relatively close to the trench to expand the etched region as shown in FIG. 12A. This permits the nitride layer to be over-polished after the planarization as shown in FIG. 13A. If the over-polishing to the nitride layer is not desired, the oxide layer is etched at an area relatively distanced from the trench to minimize the etched region as shown in FIG. 12B. This permits the nitride layer to remain not over-polished after the planarization as shown in FIG. 13B.

Figure 14A:
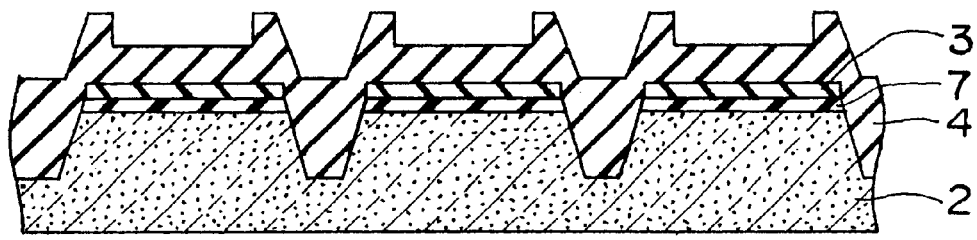
FIG. 14A and FIG. 14B are cross sectional views after the step of etching an oxide layer on multiple regions of a nitride layer in the semiconductor device manufacturing method of the fifth embodiment of the present invention.
Figure 14B:
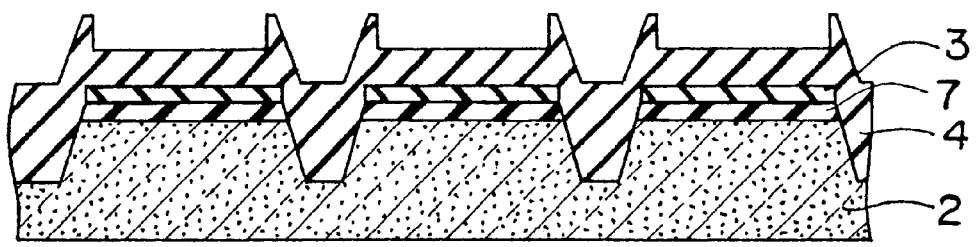
Figure 15A:
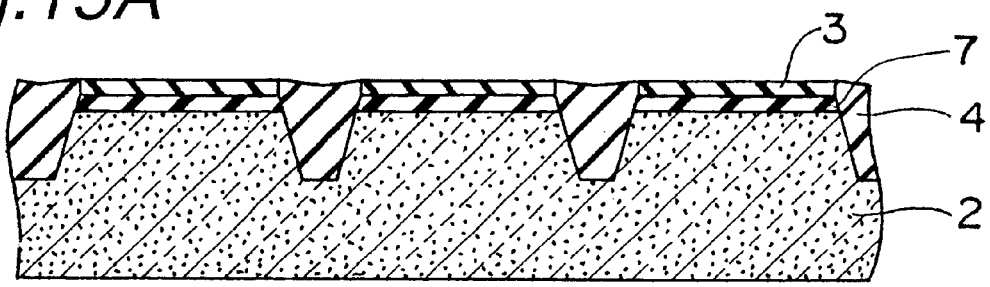
FIG. 15A and FIG. 15B are cross sectional views after the step of planarizing which follows the step shown in FIG. 14A and FIG. 14B, respectively.
Figure 15B:
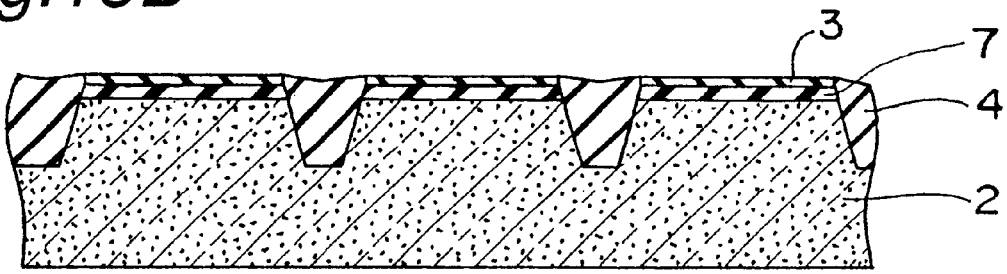

When two or more regions of the nitride layer are arranged close to each other as shown in FIG. 14 and the over-polishing to the nitride layer is not desired, the oxide layer is etched at an area relatively distanced from the trench to minimize the etched region as shown in FIG. 14A. This permits the nitride layer to remain not over-polished after the planarization as shown in FIG. 15A. When the over-polishing is desired, the oxide layer is etched at an area relatively close to the trench as shown in FIG. 14B to expand the etched region. This permits the nitride layer to be over-polished after the planarization as shown in FIG. 15B.

Figure 16A:
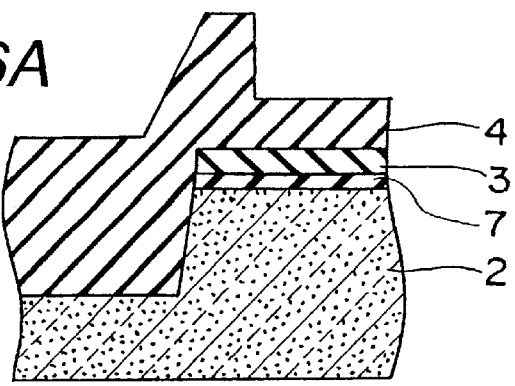
FIG. 16A and FIG. 16B are cross sectional views after the step of etching an oxide layer at an area to be locally protected from over-polishing in the semiconductor device manufacturing method of the fifth embodiment of the present invention.
Figure 16B:
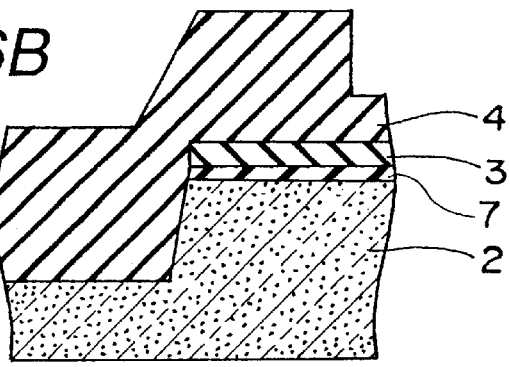
Figure 17A:
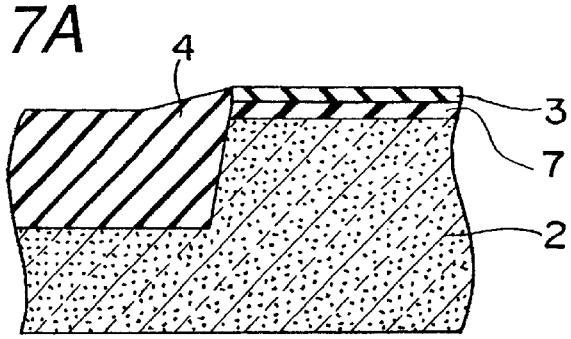
FIG. 17A and FIG. 17B are cross sectional view after the step of planarizing which follows the step shown in FIG. 16A and FIG. 16B, respectively.
Figure 17B:
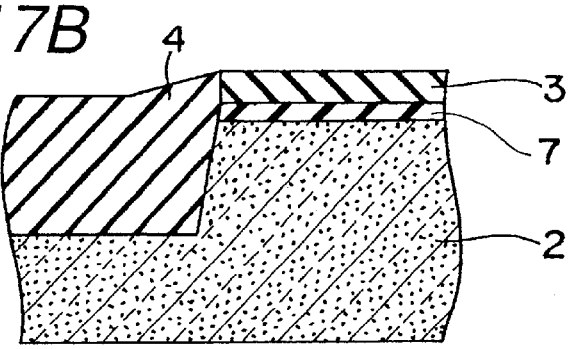
Figure 18A:
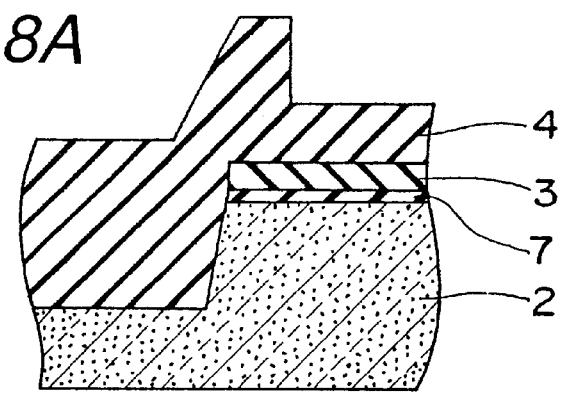
FIG. 18A and FIG. 18B are cross sectional views after the step of etching an oxide layer at an area to be locally over-polished in the semiconductor device manufacturing method of the fifth embodiment of the present invention.
Figure 18B:
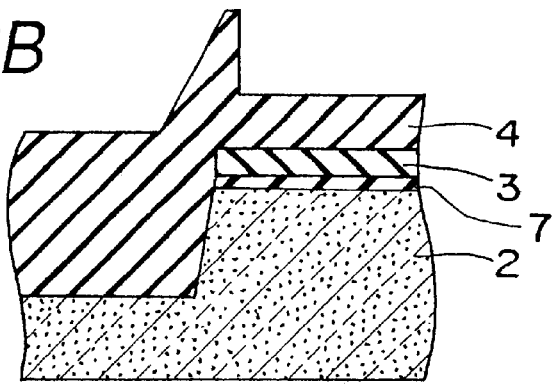
Figure 19A:
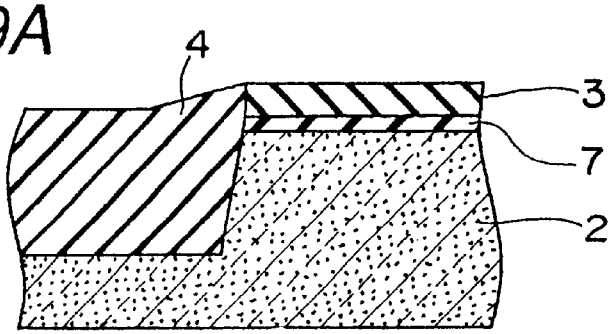
FIG. 19A and FIG. 19B are cross sectional views after the step of planarizing which follows the step shown in FIGS. 18A and FIG. 18B, respectively.
Figure 19B:
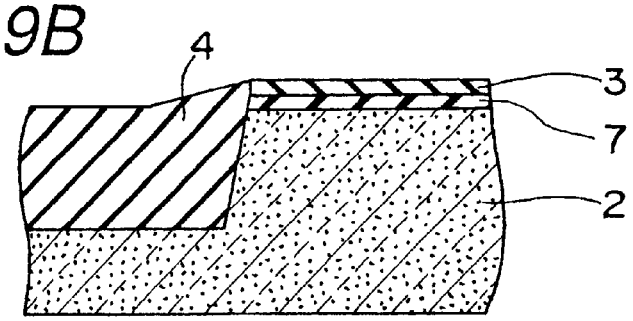

Furthermore, when a more local region is protected from the over-polishing, the oxide layer is etched at a further area distanced from the trench shown in FIG. 16B than shown in FIG. 16A to minimize the etched region. This allows the nitride layer to be less over-polished as shown in FIG. 17B than shown in FIG. 17A. When a more local region is desired to be over-polished, the oxide layer is etched at an area closer to the trench shown in FIG. 18B than shown in FIG. 18A to expand the etched region. This allows the nitride layer to be more over-polished as shown in FIG. 19B than shown in FIG. 19A.

A semiconductor device manufacturing method of the sixth embodiment of the present invention includes the step of planarizing, at which the planarizing processes having different degrees of polishing are performed several times. Therefore, the surface of the oxide layers and the nitride layers to be smoothed after the planarization.

Figure 20A:
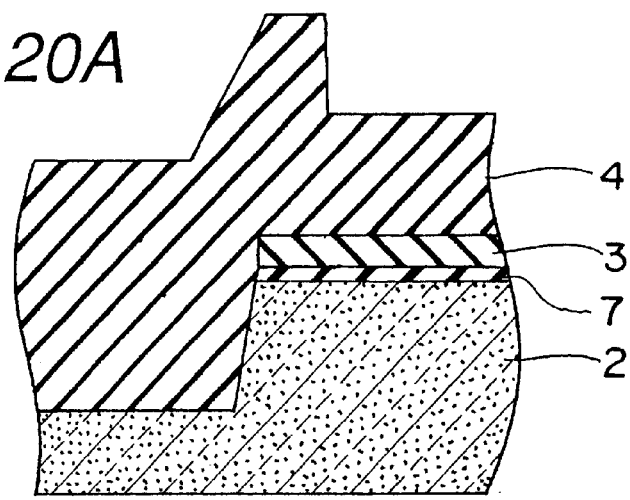
FIG. 20A is a cross sectional view after the step of etching an oxide layer in a semiconductor device manufacturing method of the sixth embodiment of the present invention.
Figure 20B:
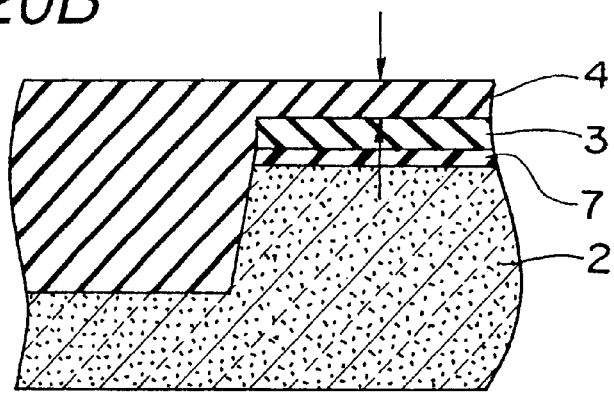
FIG. 20B is a cross sectional view after the step of first planarizing in the same.
Figure 20C:
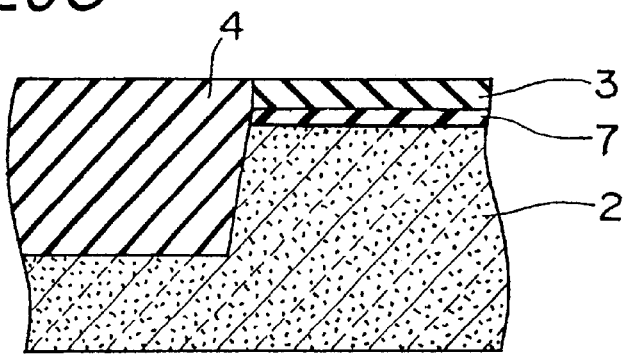
FIG. 20C is a cross sectional view after the step of second planarizing in the same.

In more detail, the semiconductor device manufacturing method of this embodiment performs the planarization process as shown in FIG. 20, after the etching of the oxide layer as shown in FIG. 20A, using a first chemical mechanical polishing technique which provides a higher degree of flatness but not a selectivity for the nitride layer as shown in FIG. 20B and then using a second chemical mechanical polishing technique which provides a lower degree of flatness but a selectively for the nitride layer as shown in FIG. 20C. Accordingly, the planarization can ensure a higher degree of flatness while the nitride layer is protected from being excessively thinned.

Figure 21A:
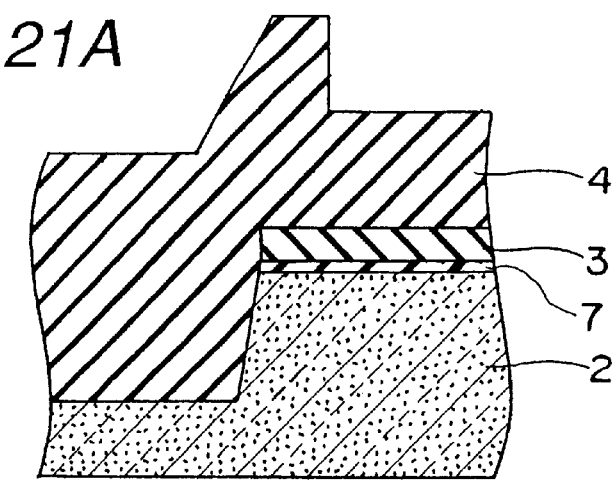
FIG. 21A is a cross sectional view after the step of etching an oxide layer in a modification of the semiconductor device manufacturing method of the sixth embodiment of the present invention.
Figure 21B:
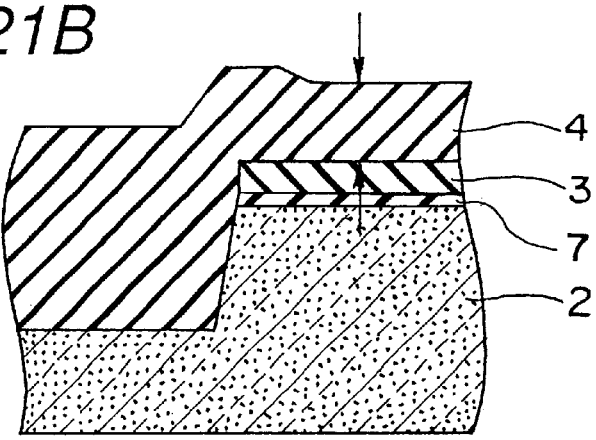
FIG. 21B is a cross sectional view after the step of first planarizing in the same.
Figure 21C:
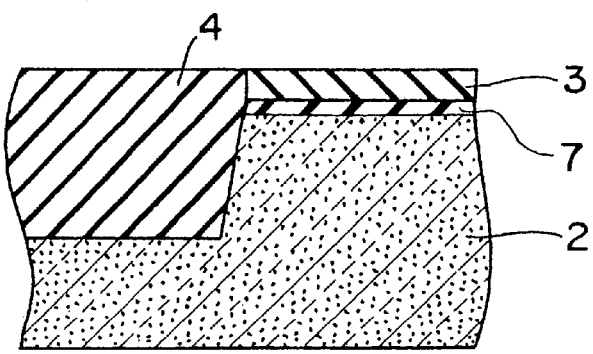
FIG. 21C is a cross sectional view after the step of second planarizing in the same.
Figure 22A:
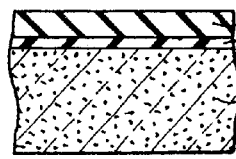
FIGS. 22A to 22D are cross sectional views explaining the steps of a conventional semiconductor device manufacturing method.
Figure 22A:
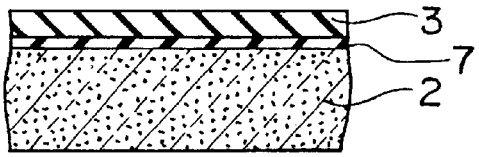
Figure 22B:
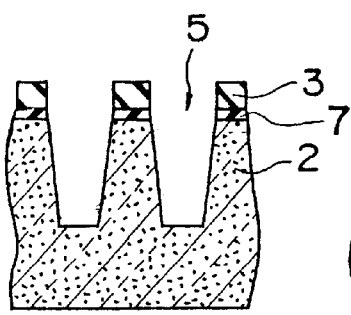
Figure 22B:
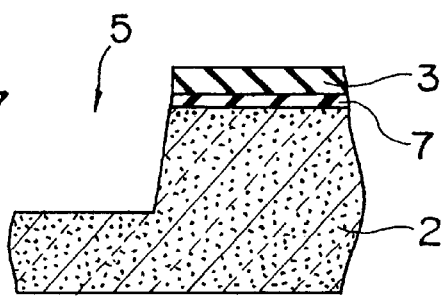
Figure 22C:
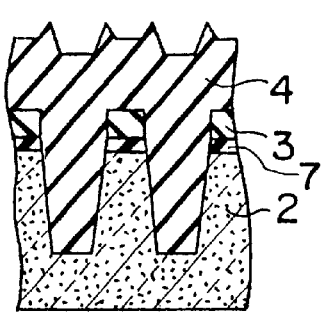
Figure 22C:
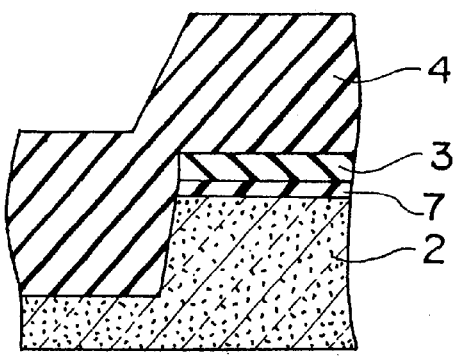
Figure 22D:
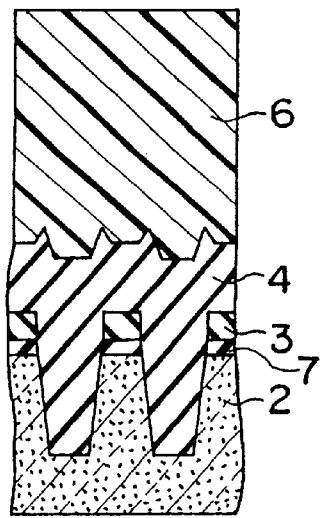
Figure 22D:
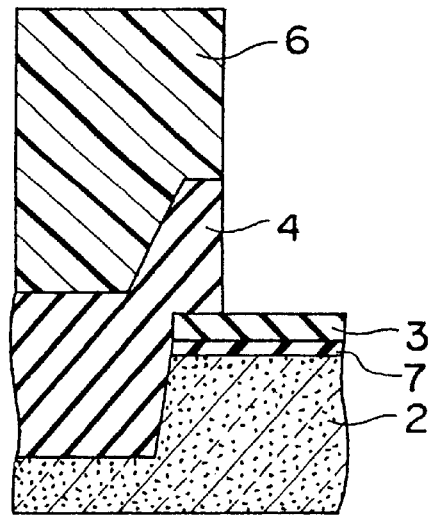
Figure 23A:
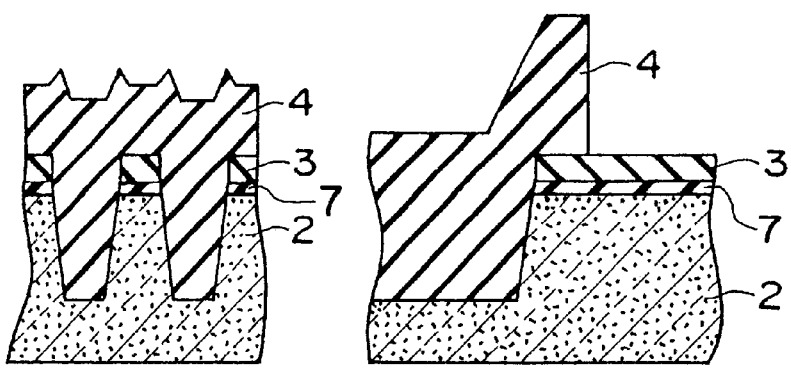
FIGS. 23A to 23D are cross sectional views explaining the steps of a conventional semiconductor device manufacturing method.
Figure 23B:
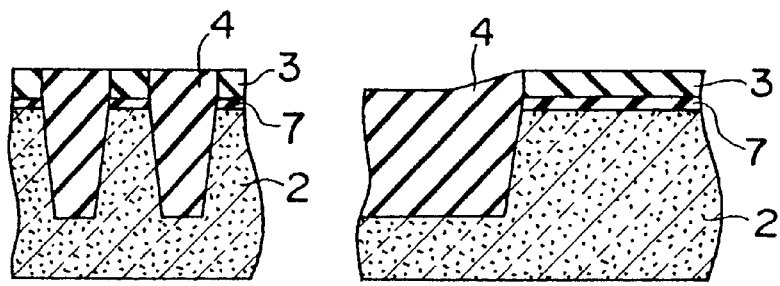
Figure 23C:
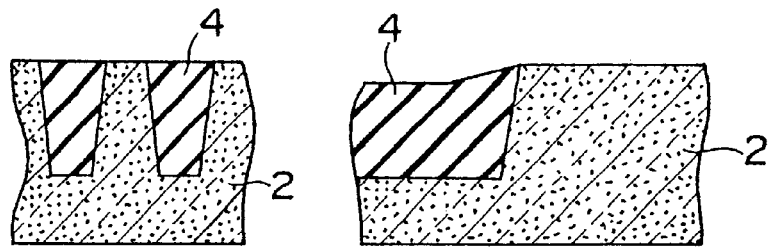
Figure 23D:
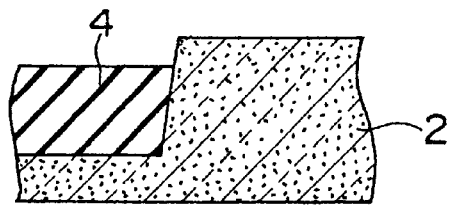

Alternatively, as shown in FIG. 21, the planarization process following the etching process as shown in FIG. 21A may be performed using the first chemical mechanical polishing technique for eliminating steps produced during the etching of the oxide layer as shown in FIG. 21B and using the second chemical mechanical technique which has a selectivity for the nitride layer as shown in FIG. 21C. As the planarization process is carried out with a combination of different degrees of polishing and the technique, the resultant surface finish can be freely determined.

In addition, a step of measuring the compensating thickness of the oxide layer left on the nitride layer to determine the degree of polishing used in the planarization may be provided between the two chemical mechanical polishing processes. Accordingly, the polishing will be made at a higher accuracy.

What is claimed is:

1. A method of manufacturing a semiconductor device comprising the steps of:
   providing a semiconductor substrate;
   forming a nitride layer on the semiconductor substrate;
   patterning the nitride layer;
   etching the semiconductor substrate while masking with a pattern of the nitride layer to form a trench;
   depositing an oxide layer to fill the trench and cover the nitride layer;
   forming a resist layer on the oxide layer;
   patterning the resist layer;
   etching the oxide layer on the nitride layer; and
   planarizing the oxide layer, wherein the step of etching the oxide layer permits a thickness of the oxide layer to be left on the nitride layer.

2. The method of manufacturing a semiconductor device according to claim 1, wherein during the step of depositing the oxide layer, the oxide layer is deposited to a controlled thickness determined from the thickness of the oxide layer left in the step of etching the oxide layer.

3. The method of manufacturing semiconductor device according to claim 1, wherein during the step of depositing the oxide layer, the oxide layer is deposited to a controlled thickness determined from a ratio of area between the nitride layer peripheral area including the nitride area itself and the oxide layer filling the trench.

4. The method of manufacturing semiconductor device according to claim 1, wherein during the step of etching the oxide layer, the oxide layer is etched to leave a thickness of the oxide layer determined from a ratio of area between the nitride layer peripheral area including the nitride area itself and the oxide layer filling the trench.

5. The method of manufacturing semiconductor device according to claim 1, wherein during the step of etching the oxide layer, the oxide layer is etched at an area distanced from the trench.

6. The method of manufacturing semiconductor device according to claim 5, wherein the area to be etched is determined from a ratio of area between the nitride layer peripheral area including the nitride area itself and the oxide layer filling the trench.

7. The method of manufacturing semiconductor device according to claim 1, wherein during the step of planarizing, the planarizing processes are performed several times.

8. The method of manufacturing semiconductor device according to claim 7, wherein during the step of planarizing, planarizing processes with different degrees of polishing are performed several times.

9. The method of manufacturing semiconductor device according to claim 7, further comprising a step of measuring the thickness of the oxide layer left on the nitride layer to determine the degree of polishing for the succeeding planarizing process, said step of measuring being provided between any two actions of planarizing process in the planarizing step.

10. The method of manufacturing a semiconductor device according to claim 1, wherein during the step of depositing the oxide layer, the oxide layer is deposited to the controlled thickness determined corresponding to the distance from the center of a wafer bearing the semiconductor substrate.

11. The method of manufacturing semiconductor device according to claim 1, wherein during the step of etching the oxide layer, the oxide layer is etched to a controlled depth determined corresponding to the distance from the center of a wafer bearing the semiconductor substrate.

12. A method of manufacturing a semiconductor device comprising the steps of:
    providing a semiconductor substrate;
    forming a trench in the semiconductor substrate;
    depositing an oxide layer to fill the trench and cover a surface of the semiconductor substrate;
    etching the oxide layer so as to leave a thickness of the oxide layer; and
    planarizing the surface of the semiconductor substrate, wherein during the step of depositing the oxide layer, the oxide layer is deposited to the controlled thickness determined corresponding to the distance from the center of a wafer bearing the semiconductor substrate.

13. The method of manufacturing semiconductor device according to claim 12, wherein during the step of etching the oxide layer, the oxide layer is etched to a controlled depth determined corresponding to the distance from the center of a wafer bearing the semiconductor substrate.

14. A method of manufacturing a semiconductor device comprising the steps of:
    providing a semiconductor substrate;
    forming a trench in the semiconductor substrate;
    depositing an oxide layer to fill the trench and cover a surface of the semiconductor substrate;
    etching the oxide layer so as to leave a thickness of the oxide layer; and
    planarizing the surface of the semiconductor substrate,
    wherein during the step of etching the oxide layer, the oxide layer is etched at an area distanced from the trench, and
    wherein the area to be etched is determined from a ratio of area between the nitride layer peripheral area including the nitride area itself and the oxide layer filling the trench.

15. A method of manufacturing a semiconductor device comprising the steps of:
    providing a semiconductor substrate;
    forming a trench in the semiconductor substrate;
    depositing an oxide layer to fill the trench and cover a surface of the semiconductor substrate, said surface including a nitride layer borne on at least a portion of the substrate;
    etching the oxide layer so as to leave a thickness of the oxide layer over the nitride layer; and
    planarizing the surface of the semiconductor substrate,
    wherein during the step of planarizing, the planarizing processes are performed several times, and
    wherein during the step of planarizing, the planarizing processes with different degrees of polishing are performed several times.

16. The method of manufacturing semiconductor device according to claim 15, further comprising a step of measuring the thickness of the oxide layer left on the nitride layer to determine the degree of polishing for the succeeding planarizing process, said step of measuring being provided between any two actions of planarizing process in the planarizing step.

* * * * *